United States Patent [19]
Hori

[11] Patent Number: 5,946,409
[45] Date of Patent: *Aug. 31, 1999

[54] PICK-UP APPARATUS AND METHOD FOR SEMICONDUCTOR DEVICES

[75] Inventor: Nobuhiro Hori, Shiga, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/654,927

[22] Filed: May 29, 1996

[30] Foreign Application Priority Data

May 31, 1995 [JP] Japan ................................. 7-133574
May 31, 1995 [JP] Japan ................................. 7-133596

[51] Int. Cl.⁶ .................................................. G06K 9/00
[52] U.S. Cl. ......................... 382/149; 382/151; 382/145; 348/87; 348/126
[58] Field of Search ..................... 382/141, 145, 382/149, 151; 356/375–376; 348/86–87, 94–95, 125–126; 324/73.1, 754

[56] References Cited

U.S. PATENT DOCUMENTS 5,377,405  1/1995  Sakurai et al. ............................. 29/833
5,570,993  11/1996  Onodera et al. .......................... 414/783
5,640,101  6/1997  Kuji et al. ................................. 324/754

FOREIGN PATENT DOCUMENTS 63-98782  4/1988  Japan .

Primary Examiner—Leo H. Boudreau
Assistant Examiner—Bhavesh Mehta
Attorney, Agent, or Firm—Whitham, Curtis & Whitham

[57] ABSTRACT

A pick-up operation is improved by finding a next non-faulty chip during pick-up of a non-faulty chip. Chips are disposed in alignment with X and Y directions as divided from a wafer, and the field of view of a camera which views the chips is established to provide the image data for the chips. A first non-faulty chip is selected, located at the center of the field of view of the camera, and picked up. During the pick-up of the first non-faulty chip, a chip group comprising a given number of chips is subjected to a preceding recognition which determines a next non-faulty chip to be selected on the basis of the image data. The next non-faulty chip is then positioned at the center of the field of view of the camera for a pick-up operation, thereby saving time period for pick-up operation.

17 Claims, 5 Drawing Sheets

9 PICK-UP SECTION

PICK-UP APPARATUS AND METHOD FOR SEMICONDUCTOR DEVICES

BACKGROUND OF THE INVENTION (a) Field of the Invention

The invention relates to a pick-up apparatus and method and, more particularly, to an image recognition in a pick-up apparatus and a pick-up method which are used during a mounting step for packaging semiconductor devices.

(b) Description of the Related Art

In a mounting step for semiconductor devices which occurs during packaging thereof, a multiplicity of semiconductor pellets or chips are disposed in an aligned arrangement as divided from a semiconductor wafer. The semiconductor chips are subjected to an image recognition before pick-up in order that only non-faulty chips be picked up for mounting or packaging.

Specifically, a multiplicity of chips disposed in an aligned arrangement on an X-Y plane are viewed one by one by a camera, and a chip which is located within the field of view of the camera is subjected to an image processing step. During the image processing step, an image data of a chip, which is obtained on the basis of a video signal from the camera, is stored in a frame memory, and an image recognition is applied to such image data to determine if a particular chip is faulty or non-faulty. The decision to determine whether a chip is faulty or non-faulty is carried out on the basis of the presence or absence of the chip itself at that position, the presence or absence of a fault in the appearance such as a notch, and the presence or absence of a faulty mark applied to the chip surface. After completion of the image recognition, a chip which is determined to be non-faulty is picked up by a devoted jig called "collet", which applies a vacuum suction to the non-faulty chip.

A conventional operation will be described below in which a single chip is placed in the field of view of a camera and then subjected to an image recognition in order to allow non-faulty chips to be sequentially picked up.

Initially, chips are disposed in a matrix on an X-Y plane so as to be aligned in X and Y directions. A particular chip which is placed in the field of view of a camera is viewed at a pick-up position by the camera for an image recognition. Based on the presence or absence of a faulty mark etc., a decision is made if it is faulty or non-faulty. When a decision is made that the particular chip is non-faulty, the location of the particular chip is finely adjusted at the pick-up position, and is picked up subsequent to the completion of the adjustment.

When the pick-up operation is completed, a next chip located adjacent to the first mentioned particular chip is moved to the pick-up position through a predetermined one pitch move so as to be viewed by the camera within the field of view thereof. The second chip is again subjected to an image recognition to determine if it is faulty or non-faulty, and if the next chip is determined to be non-faulty, the location thereof is finely adjusted at the pick-up position in a similar manner as mentioned before, whereupon the next chip is picked up. On the other hand, if the chip is found to be faulty, no pick-up operation takes place for this chip, and instead, another one pitch move takes place for the X-Y plane to bring the succeeding chip to the pick-up position so as to locate the succeeding chip in the field of view of the camera for the image recognition.

In the manner as described above, a sequence for operations including an image recognition of a chip located within the field of view of the camera, a decision made on the basis of a faulty mark etc. to determine if the chip is faulty or non-faulty, a pick-up of a non-faulty chip and one pitch move for a succeeding chip is repeated for each of the chips arranged in the matrix on the X-Y plane.

SUMMARY OF THE INVENTION

In view of the foregoing, it is an object of the invention to provide a pick-up apparatus and method which enables an improved throughput by increasing the speed with which a pick-up operation of a chip is carried out.

In accordance with the invention, there is provided a pick-up method for picking up semiconductor chips. The method includes the steps of forming a chip group of a plurality of chips located within a first field of view of a camera, the plurality of chips being arrayed substantially in a matrix, processing image data supplied from the camera to find a first non-faulty chip, if any, in the first chip group, positioning the first non-faulty chip at a pick-up position, picking up the first non-faulty chip at the pick-up position, finding a second non-faulty chip, if any, in the first chip group before completion of the picking up of the first non-faulty chip by processing the image data, and positioning the second non-faulty chip at the pick-up position.

In accordance with the invention, there is also provided a pick-up apparatus comprising an X-Y table for mounting a plurality of chips, an X-Y table driver for moving the X-Y table in X and Y directions, an optical system for establishing a field of view for a at least a part of the plurality of chips, a signal processor receiving image data from the optical system to generate data for location of each of the chips and to determine a faulty or non-faulty state for each of the chips, a pick-up device for picking up each non-faulty chip at a pick-up position, and a control section for controlling the signal processor to find a next non-faulty chip before completion of the picking up by the pick-up device.

In the conventional pick-up apparatus, as described before, it is noticed that the image recognition of a chip takes place by establishing a condition that a single chip is received within the field of view of the camera for the image recognition, and is performed for each chip one after another independently from whether the chip is faulty or non-faulty. After a decision is made which determines if the chip is faulty or non-faulty, a pick-up operation is executed for a non-faulty chip while no pick-up operation takes place for a faulty chip, and instead, another one pitch move follows to bring a next succeeding chip into the field of view of the camera.

In the prior art, it is difficult, therefore, to achieve a rapid execution of the image recognition for the chips, which are many in number, presenting a difficulty in improving the throughput of the pick-up operation. Where there are a number of faulty chips in the single semiconductor wafer, the operational efficiency will be further degraded.

In contrast to the prior art, the pick-up operation can be increased in speed, in accordance with the present invention, by executing a preceding image recognition of chips in a group which are located within the field of view of a camera during a time interval when a pick-up operation is carried out or before the pick-up operation is completed.

BRIEF DESCRIPTION OF THE DRAWING

The above and other objects, features and advantages of the invention will be more apparent from the following description taken in conjunction with accompanying drawings, in which.

DESCRIPTION OF THE PREFERRED EMBODIMENT

Now, embodiments of the invention will be described with reference to accompanying drawings.

Figure 1:
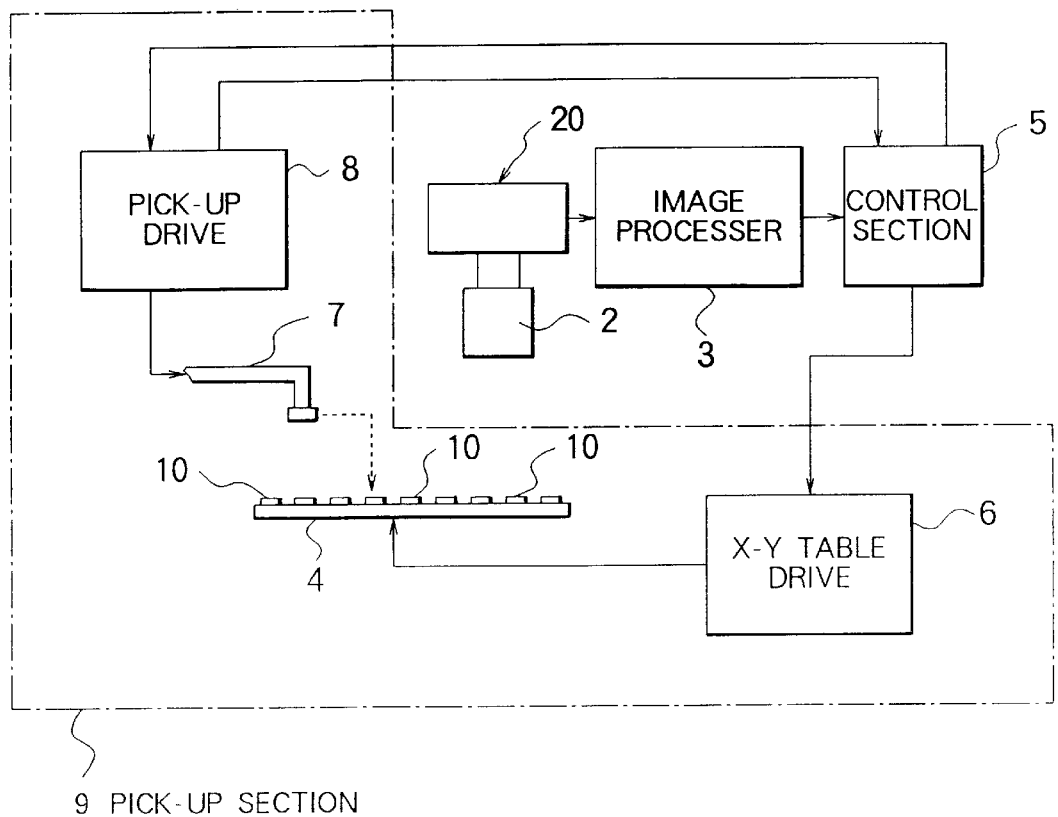
FIG. 1 is a schematic block diagram of a pick-up apparatus of a first embodiment of the invention.

The general arrangement of a pick-up apparatus according to the principle of the invention will be first described. Referring to FIG. 1, a plurality of chips 10, which are disposed in a matrix so as to be aligned in X and Y directions, are viewed by an optical system 20 including a camera 2. A video signal from the camera 2 is fed to an image processor 3 which converts the video signal into a binary or multi-level signal to provide image data to a control section 5. It is to be noted that the chips 10 are mounted on an X-Y table 4 which is movable in both X and Y directions. The image data thus obtained for the chips located within the field of view of the camera 2 are stored in a frame memory of the control section 5. While deciding the faulty or non-faulty state of individual chips 10 by a preceding recognition based on such image data by the control section 5, a pick-up section 9, which includes the X-Y table 4, an X-Y table drive 6 for driving the X-Y table 4, and a pick-up drive 8 for driving a collet 7 to pick up a particular chip 10 by applying a vacuum suction thereto, is operated to bring one of non-faulty chips to the center of the field of view of the camera 2 so as to sequentially pick up the non-faulty chips.

Figure 2:
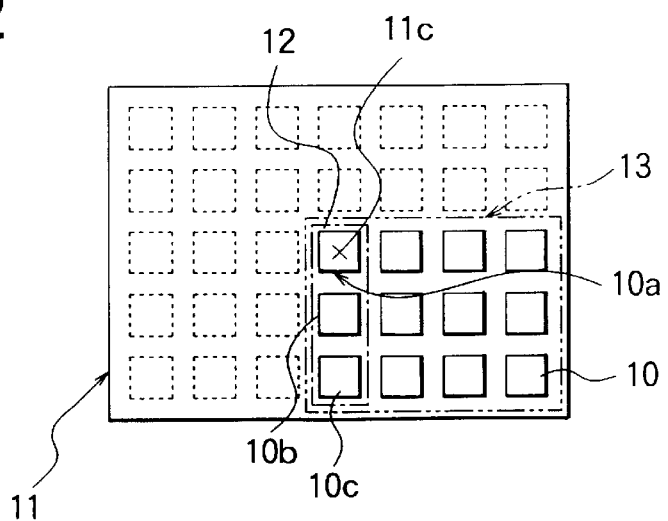
FIG. 2 is a schematic illustration of an example of the field of view of the camera in the pick-up apparatus of FIG. 1.
Figure 3:
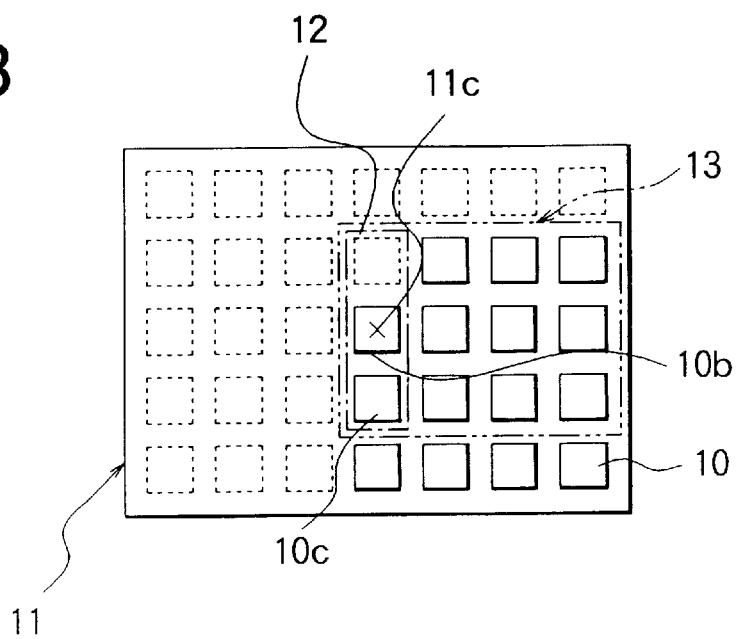
FIG. 3 is a schematic illustration of the field of view of the camera after the step of FIG. 2.

Specifically, the image processor 3 receives image data for a plurality of chip 10 viewed by the camera 2 establishing a field of view 11 (refer additionally to FIG. 2). The image processor 3 then executes a preceding image recognition which is based on the image data for a chip column 12 in group 13 of the chips 10 located within the field of view 11. The pick-up section 9 operates to pick up a single non-faulty chip 10a in FIG. 2, which is located at a pick-up position, namely at the center 11c of the field of view 11 and found non-faulty based on the image recognition, by applying a vacuum suction from the collet 7. During the time period the pick-up section 9 performs a pick-up operation for the particular chip 10a, the control section 5 performs a preceding image recognition in succession along a chip column 12 including the particular chips in the Y direction and along the X direction for each chip column 12 in the chip group 13 until a next non-faulty chip 10b is found by the image processor 3. In the example of the field of view of the camera in FIG. 2, the chips other than those in the chip group 13 are not left in the precedent operation. The control section 5 controls the pick-up section 9 to locate the next non-faulty chip 10b in the column 12 at the center 11c of the field of view 11, as shown in FIG. 3, on the basis of the preceding image recognition.

The preceding image recognition provides the data for each chip position indicating the location or co-ordinates of the position, the presence or absence of the chip 10 itself, the presence or absence of any fault in the appearance of the chip surface such as a notch, and the presence or absence of a faulty mark which is applied to the chip surface after an electric test which takes place at the previous stage. A decision is made on the basis of such data of the preceding image recognition, indicating if each individual chip in the chip group 13 is faulty or non-faulty. Based on such decision, a non-faulty chip adjacent to the picked up chip is positioned at the center 11c of the field of view 11 of the camera in order to perform a pick-up operation thereto.

Figure 4:
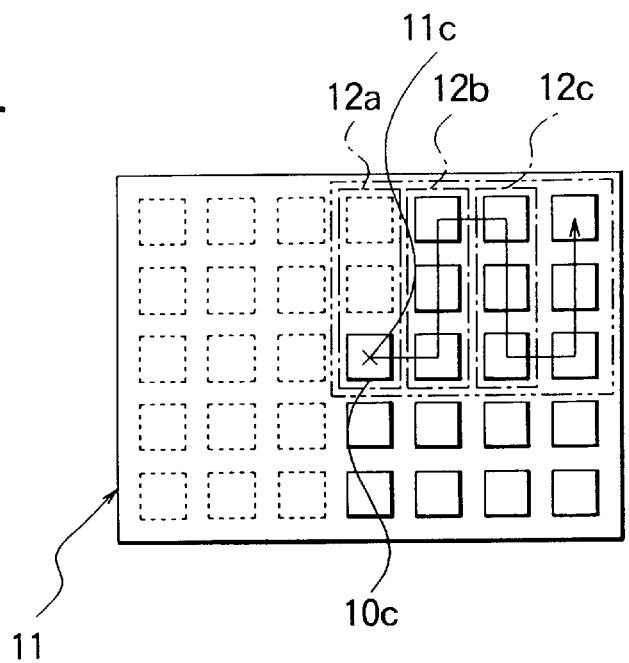
FIG. 4 is a schematic illustration of the field of view of the camera after the step of FIG. 3.

After the next chip 10b is positioned at the center 11c of the field of view 11 of the camera 2, an output signal from the control section 5 operates the pick-up drive 8, allowing the collet 7 to pick up the chip 10b by applying a vacuum suction thereto. Thereafter, a remaining chip 10c in the chip column 12, which is found to be non-faulty, is similarly positioned at the center 11c of the field of view 11 of the camera (see FIG. 4) before it is picked up.

Subsequently, assuming that all the chips in the chip group 13 are non-faulty, upon completion of the pick-up operation for the first chip column 12a, the operation transfers to the next adjacent chip column 12b, which is located adjacent to the first chip column 12a. In this case, the chip in the second chip group 12b adjacent to the chip 10c is then located at the pick-up position. It is to be noted that chips 10 in the group 13 are picked up sequentially following a path of movement, as indicated by an arrow shown in solid line in FIG. 4 so as to minimize the length of the movement of the X-Y table based on the data of the preceding recognition.

Figure 5:
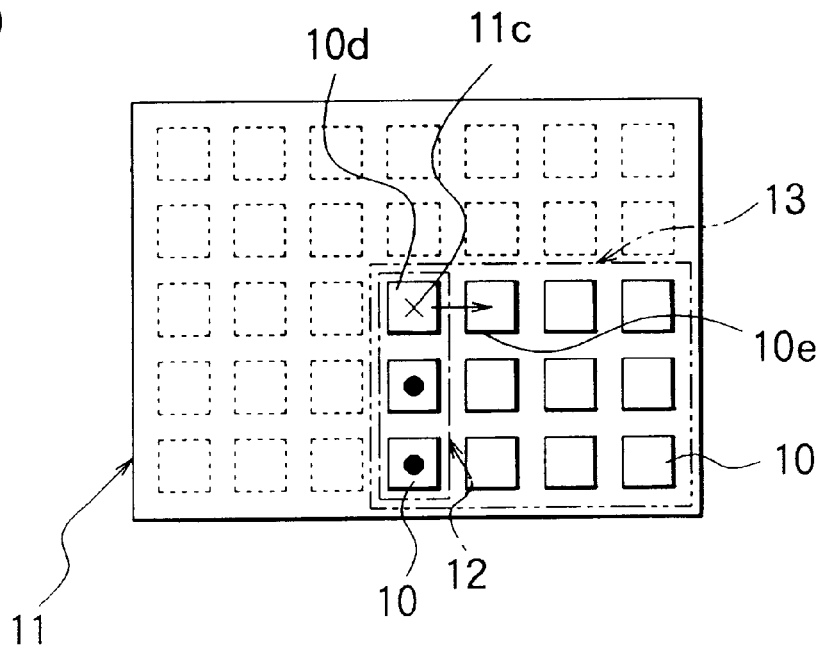
FIG. 5 is a schematic illustration of another example of the field of view of the camera in the pick-up apparatus of FIG. 1.

In the event that it is found, in another example of the field of view shown in FIG. 5, upon completion of the pick-up operation for a first chip 10d in the group 13 located at the center 11c of the field of view 11 that the remaining chips 10 in the chip column 12a are faulty, the faulty chips 10 being shown in solid black circles thereon, a movement takes place to the right along a path indicated by an arrow shown in solid line in the drawing based on the data of the preceding image recognition so as to skip the faulty chips 10, thereby selecting a non-faulty chip 10e in the next column. In this instance, the non-faulty chip 10e located adjacent to and at the minimum distance from the first chip 10d is then positioned at the center 11c of the field of view 11 and picked up.

Figure 6:
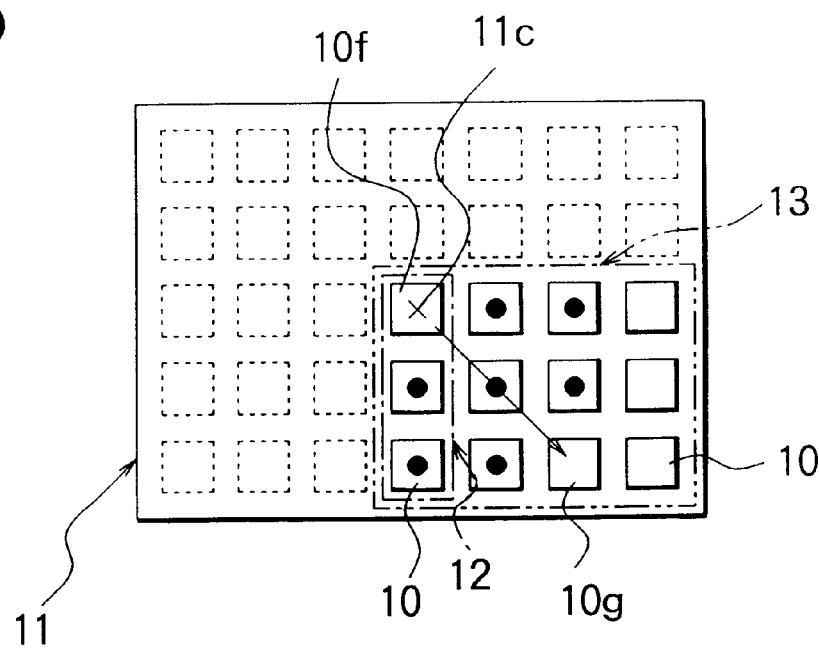
FIG. 6 is a schematic illustration of still another example of the field of view of the camera in the pick-up apparatus of FIG. 1.

Also, in the event that it is found in still another example of FIG. 6, upon completion of the pick-up operation of a first chip 10f in the group 13 located at the center 11c of the field of view 11, that faulty chips 10 appear in succession until a non-faulty chip 10g in the third column is reached, a movement based on the data of the preceding recognition takes place in the manner indicated by an oblique arrow shown by solid line in the drawing, thereby directly moving to the non-faulty chip 10g in the third column, skipping all of the faulty chips 10. In this instance, the movement occurs in a minimum length of time to locate the non-faulty chip 10g at the center 11c of the field of view 11.

Figure 7:
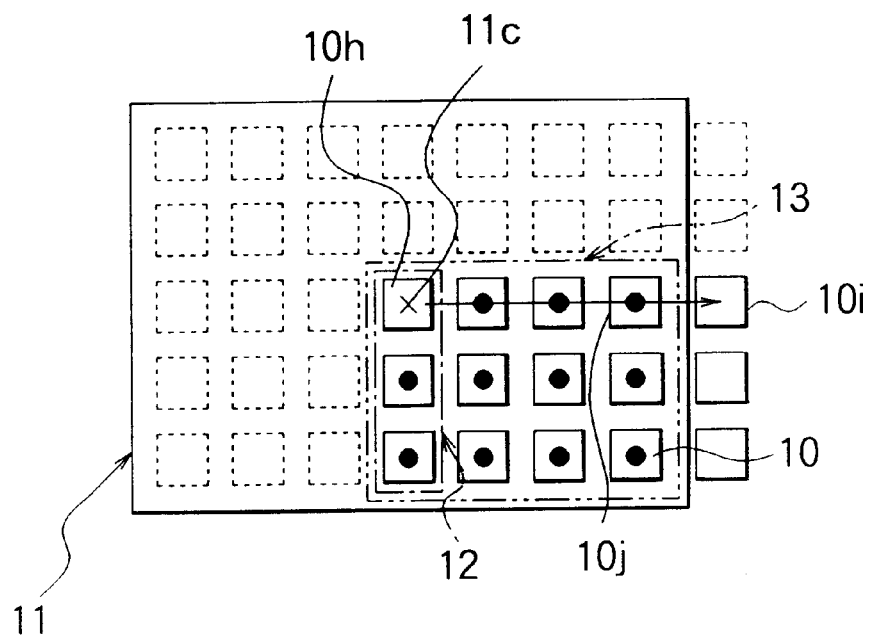
FIG. 7 is a schematic illustration of still another example of the field of view of the camera in the pick-up apparatus of FIG. 1.

In the event that it is found in still another example of FIG. 7, upon completion of the pick-up operation of a first chip 10h in the group 13 located at the center 11c of the field of view 11, that all the chips 10 in the chip group 13 which have been subjected to the preceding image recognition are faulty except for the first chip 10h and no remaining group is left in the field of view 11, a movement takes place to the right based on data of the preceding recognition to a chip 10i which is located outside and adjacent to the field of view 11, and therefore, which is located at the shortest distance from the chip 10h.

That is, the chip 10i which was located outside the field of view 11 is now positioned at the center 11c of the field of view 11, subjected to a preceding recognition together with other chips now in a group, and then picked up. In this instance, the path of the movement of the chip 10i to the center 11c of the field of view 11 is calculated by adding one pitch of the chip arrangement in the row to the length of a path to move along from the chip 10h to a faulty chip 10j which is located adjacent to the chip 10i. This avoids a positioning error caused by an accumulation of a single pitch move or travel from the center 11c of the field of view 11, thereby allowing a chip 10i located outside the field of view of the camera to be positioned at the pick-up position with a high accuracy.

Figure 8:
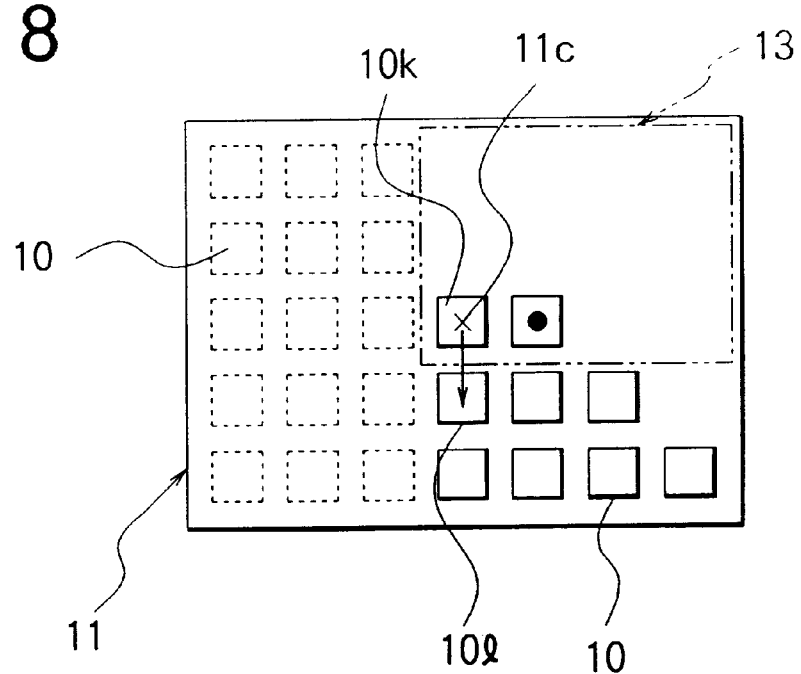
FIG. 8 is a schematic illustration of still another example of the field of view of the camera in the pick-up apparatus of FIG. 1.

In the event that it is found in still another example of FIG. 8, upon completion of the pick-up operation of a chip 10k now located at the center 11c of the field of view 11, that no non-faulty chips exists following the chip 10k in the chip group 13, a movement takes place in the Y direction from the chip 10k in the field of view 11 to the chip 10l located adjacent to the chip group 13 in the Y direction, as indicated by an arrow shown in solid line, based on data of the preceding image recognition. The preceding image recognition for the chip 10l and other chips in a new chip group is then executed.

A pick-up apparatus according to a second embodiment of the invention will now be described. The configuration of the apparatus of the invention is similar to that shown in FIG. 1.

As is the case of the first embodiment, the image processor 3 operates to produce image data by digitizing a video signal from the optical system 1 corresponding to the field of view of the camera, which views the plurality of chips 10, into a binary signal. In response to an output signal from the control section, the X-Y table drive 6 drives the X-Y table 2 to position the non-faulty chip at the pick-up position. The pick-up drive 8 operates the collet 7 to apply a vacuum suction to the chip which is located at the pick-up position, thus picking it up.

It is to be noted that the center of the particular chip at the pick-up position is often offset from the true center 11c of the field of view 11 of the camera before adjustment. In the present embodiment, the image processor 3 subjects a plurality of chips located in a chip group within the field of view of the camera 2 to a preceding recognition during the pick-up operation of the selected chip.

If a misalignment of the position of the present particular chip to be picked up is found, before adjustment of the chip location at the pick-up position, with respect to the true center of the field of view because of the error in the distance between the precedent particular chip and the present particular chip stored as the precedent recognized data, the misalignment is corrected by an automatic teaching routine during the adjustment for the present particular chip, and the corrected value is also used for positioning of a next particular chip.

Such correction supplied by the automatic teaching routine is updated for every subsequent preceding image recognition so that a corrected value obtained from a previous preceding image recognition is applied to the subsequent preceding image recognition before a particular chip is located at the pick-up position. The control section 7 operates the X-Y table drive 6 to drive the X-Y table 2 in accordance with the corrected value, thereby positioning the particular chip at the center of the field of view of the camera with a high accuracy. The principle of the correction will be specifically described below with reference to the drawings.

Figure 9:
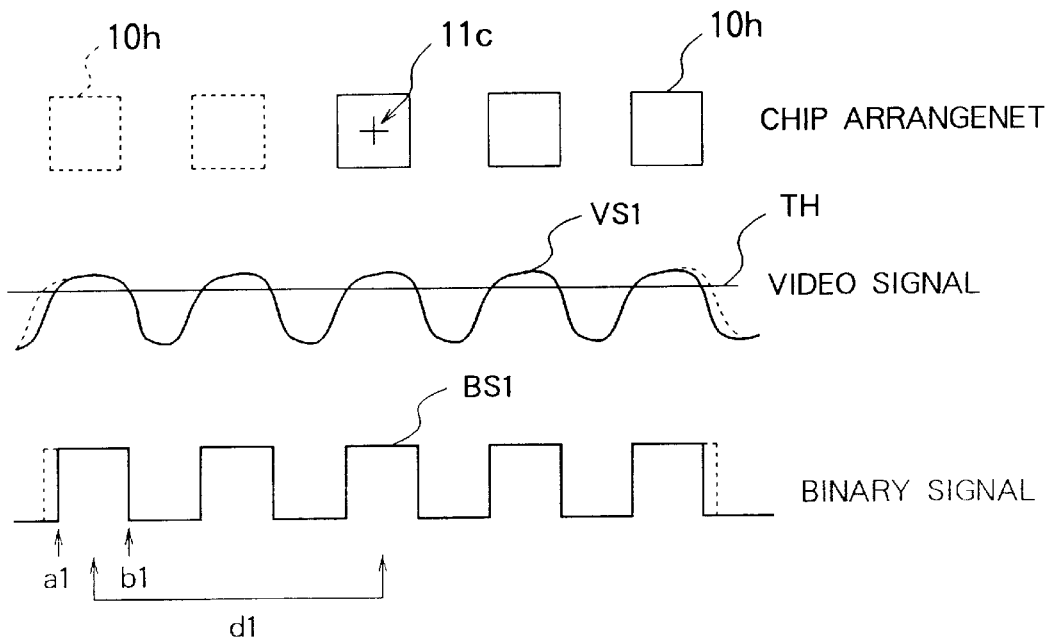
FIG. 9 is an illustration of waveforms for illustrating a video signal and a binary signal obtained from a chip arrangement viewed by a camera in a pick-up apparatus according to a second embodiment of the invention.
Figure 10:
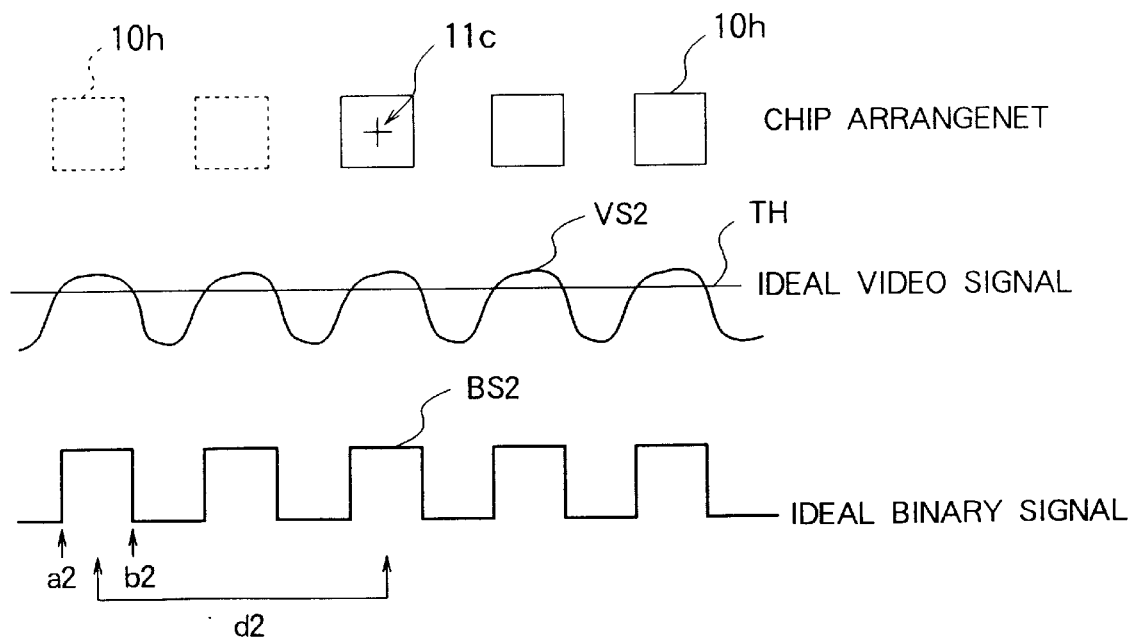
FIG. 10 is an illustration of correct waveforms as compared to the waveforms of FIG. 9.

FIG. 9 shows image signals including wave distortions and obtained from an illustrated row of chips 10, and is compared with the correct or ideal signal illustrated in FIG. 10 as obtained from a similar row of the chips 10.

Specifically, FIG. 9 illustrates that a video signal VS1 generated from the arrangement of the chips 10 and produced by the optical system does not assume a correct rectangular waveform but has a significant waveform distortion due to an illumination distribution, distortion involved with lenses in the optical system or the like. As an example, waveform distortion in the video signal VS1 which occurs with the chip 10h located at either end of the field of view of the camera is specifically shown in the drawing. The video signal VS1 generally digitized with a threshold value TH, therefore, provides a binary signal BS1 including an error. That is, the binary signal BS1 will have a rising edge a1 which will be displaced from an ideal rising edge a2 of the binary signal BS2 in FIG. 10. A midpoint between the rising edge a1 and a falling edge b1 will be offset from midpoint between the ideal rising edge a2 and falling edge b2 in FIG. 10, namely, the actual center of the chip, thereby generating distance d1 having an error with respect to the real distance d2. Accordingly, misalignment of the chip is generated during positioning of the particular chip.

To accommodate for the misalignment generated during positioning of the particular chip, a correction is made by a second positioning of the particular chip. In accordance with the present embodiment, the corrected value is stored in the control section, which corrects the distance d1 during the next determination of the distance between the present particular chip and the next particular chip. The chips are generally arranged at a uniform pitch so that the corrected value is effectively applied to the next determination. The corrected value is updated during each of the subsequent determinations, thereby executing an automatic teaching routine for the corrected value.

In order to minimize the influence of aging effect or the like, a correction used in the automatic teaching routine is updated for every preceding image recognition, thus applying a latest corrected value to a corresponding preceding recognition data. When executing preceding image recognition for the chips which are arranged in a uniform pitch, a correction which is included in and obtained from the previous preceding recognition is applied to the subsequent preceding recognition. In this manner, in response to a command from the control section, the X-Y table drive 6 drives the X-Y table 2 to position the chip at a pick-up position, defined by the center of the field of view, with a high accuracy.

The correction which is used in the automatic teaching routine is defined as the misalignment between the center of the chip and the center of the field of view of the camera which occurs when the chip is positioned at the center of the field of view. A misalignment which is determined in each pixel in the frame may be used as the correction, or the resolution in recognizing the position of the chip within the field of view may be used as such a corrected value.

In this manner, each individual chip can be positioned at the pick-up position defined by the center of the field of view of the camera with a high accuracy, free from adverse influences of an illumination distribution on the chip surface or lens distortions of the optical system, thereby allowing a rapid pick-up operation with a high reliability to be realized.

Since above embodiments are described only for examples, the present invention is not limited to such embodiments and it will be obvious for those skilled in the art that various modifications or alterations can be easily made based on the above embodiments within the scope of the present invention.

What is claimed is:

1. A pick-up method for picking up semiconductor chips, said method including steps of:

forming a first chip group of a plurality of chips located within a first field of view of a camera, said plurality of chips being arrayed substantially in a matrix, processing image data supplied from said camera to find a first non-faulty chip, if any, in said first chip group, positioning said first non-faulty chip at a pick-up position, picking up said first non-faulty chip at said pick-up position, performing a preceding image recognition for at least two additional chips in said first chip group regardless of whether one of said additional chips is faulty or not, said preceding image recognition for said at least two additional chips being performed during picking up of said first non-faulty chip, finding a second non-faulty chip, if any, in said first chip group based on the preceding image recognition performed during picking up of said first non-faulty chip, and positioning said second non-faulty chip at said pick-up position.

2. A pick-up method as defined in claim 1 wherein said second non-faulty chip is selected from a plurality of non-faulty chips in said first chip group based on the distance between said first non-faulty chip and each of said plurality of non-faulty chips.

3. A pick-up method as defined in claim 1, further including the step of:

establishing a second field of view of the camera after a final non-faulty chip is picked up in said first chip group, said establishing step being performed at a time when said first field of view includes no remaining chips other than faulty chips, if any, in said first chip group, and wherein said establishing of said second field of view is effected by moving said camera by a first length, said first length being calculated by adding a predetermined one pitch length to a distance between said pick-up position and a first chip in said first field of view located adjacent to a boundary of said first field of view.

4. A pick-up method as defined in claim 1, further comprising:

finding at least a third non-faulty chip in said first chip group based on the preceding image recognition performed during picking up of said first non-faulty chip.

5. A pick-up method as defined in claim 4, further comprising:

forming a second chip group adjacent to said first chip group when no more non-faulty chips are left in said first chip group.

6. A pick-up method as defined in claim 4, further comprising:

picking up said second non-faulty chip at said pick-up position, positioning at least said third non-faulty chip at said pick-up position, and picking up at least said third non-faulty chip.

7. A pick-up method as defined in claim 1, wherein in said performing step, said preceding image recognition is performed successively for said additional chips in said first group during picking up of said first non-faulty chip.

8. A pick-up method as defined in claim 1, wherein said second non-faulty chip is a chip adjacent to said first non-faulty chip in said matrix.

9. A pick-up method as defined in claim 1, wherein said second non-faulty chip is a chip which is not adjacent to said first non-faulty chip in said matrix.

10. A pick-up method as defined in claim 1, wherein at least one chip from said first chip group resides between said first non-faulty chip and said second non-faulty chip.

11. A pick-up method as defined in claim 1, wherein said first non-faulty chip and said second non-faulty chip are in different columns of said matrix.

12. A pick-up method as defined in claim 1, wherein said second non-faulty chip lies outside of said first field of view.

13. A pick-up method as defined in claim 1, wherein if a chip adjacent to said first non-faulty chip in said matrix is determined to be faulty based on the preceding image recognition performed during picking up of said first non-faulty chip, no chips in said matrix are positioned at said pick-up position until said second non-faulty chip is found based on the preceding image recognition performed during picking up of said first non-faulty chip.

14. A pick-up method as defined in claim 1, wherein said step of positioning said second non-faulty chip at said pick-up position requires said second non-faulty chip to be moved diagonally within said matrix.

15. A pick-up apparatus comprising:

an X-Y table for mounting a plurality of chips, an X-Y table driver for moving said X-Y table in X and Y directions, an optical system for establishing a field of view for at least a part of said plurality of chips and for generating image data from said field of view, a signal processor for receiving said image data from said optical system, for generating, based on said image data, data indicative of a location of each of said chips, and for determining a faulty or non-faulty state for at least two of remaining ones of said chips in said field of view, a pick-up device for picking up non-faulty chips, said pick-up device picking up a first non-faulty chip within said field of view at a pick-up position, and a control section for controlling said signal processor to find a next non-faulty chip before completion of picking up by said pick-up device, said signal processor finding said next non-faulty chip based on said signal processor performing image recognition for at least two additional chips in said field of view regardless of whether one of said two additional chips is faulty or not and before completion of picking up of said first non-faulty chip.

16. A pick-up apparatus as defined in claim 15, wherein said control section selects said next non-faulty chip from a plurality of non-faulty chips within said field of view based on a distance between said pick-up position and each of said plurality of non-faulty chips.

17. A pick-up apparatus as defined in claim 15, wherein said control section calculates an error based on a first length obtained by image data from said optical system indicative of a distance between said pick-up position and one of said chips within said field of view located at a first position and an amount of movement by said X-Y table, and corrects said first length before positioning of a next one of said chips located at said first position to said pick-up position.

\* \* \* \* \*